United States Patent
Lee et al.

(10) Patent No.: US 7,772,021 B2
(45) Date of Patent: Aug. 10, 2010

(54) FLAT PANEL DISPLAYS COMPRISING A THIN-FILM TRANSISTOR HAVING A SEMICONDUCTIVE OXIDE IN ITS CHANNEL AND METHODS OF FABRICATING THE SAME FOR USE IN FLAT PANEL DISPLAYS

(75) Inventors: Je-hun Lee, Seoul (KR); Dong-ju Yang, Seoul (KR); Tae-hyung Ihn, Seoul (KR); Do-hyun Kim, Seoul (KR); Sun-young Hong, Gyeonngi-do (KR); Seung-jae Jung, Seoul (KR); Chang-oh Jeong, Gyeonggi-do (KR); Eun-guk Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 203 days.

(21) Appl. No.: 11/947,725

(22) Filed: Nov. 29, 2007

(65) Prior Publication Data
US 2008/0128689 A1    Jun. 5, 2008

(30) Foreign Application Priority Data
Nov. 29, 2006  (KR) .................. 10-2006-0119166
Nov. 21, 2007  (KR) .................. 10-2007-0119287

(51) Int. Cl.
*H01L 21/00*   (2006.01)
*G02F 1/136*   (2006.01)
*H01L 29/16*   (2006.01)
*H01L 31/00*   (2006.01)

(52) U.S. Cl. .................. 438/30; 438/48; 257/E21.535; 257/E21.536; 257/E27.112; 257/E27.131; 257/57; 257/59; 257/72; 257/83; 257/257; 257/290; 349/42; 349/46; 349/139; 349/147

(58) Field of Classification Search .................. 257/57, 257/59, 72, 83, 257, 290, E27.112, E27.131, 257/E21.535, E21.536; 438/30, 48; 349/42, 349/46, 139, 147
See application file for complete search history.

(56) References Cited

U.S. PATENT DOCUMENTS 6,081,308 A *   6/2000  Jeong et al. .................. 349/42
2006/0108587 A1* 5/2006  Lee et al. .................. 257/72

* cited by examiner

*Primary Examiner*—Long K Tran
(74) *Attorney, Agent, or Firm*—Innovation Counsel LLP

(57) ABSTRACT

Provided is a method of fabricating a semiconductive oxide thin-film transistor (TFT) substrate. The method includes forming gate wiring on an insulation substrate; and forming a structure in which a semiconductive oxide film pattern and data wiring are stacked on the gate wiring, wherein the semiconductive oxide film pattern is selectively patterned to have channel regions of first thickness and source/drain regions of greater second thickness and where image data is coupled to the source regions by data wiring formed on the source regions. According to a 4-mask embodiment, the data wiring and semiconductive oxide film pattern are defined by a shared etch mask.

14 Claims, 7 Drawing Sheets

FLAT PANEL DISPLAYS COMPRISING A THIN-FILM TRANSISTOR HAVING A SEMICONDUCTIVE OXIDE IN ITS CHANNEL AND METHODS OF FABRICATING THE SAME FOR USE IN FLAT PANEL DISPLAYS

This application claims priority from Korean Patent Application No. 10-2006-0119166 filed on Nov. 29, 2006 and Korean Patent Application No. 10-2007-0119287 filed on Nov. 21, 2007 in the Korean Intellectual Property Office, the disclosures of which are incorporated herein by reference in their entirety.

BACKGROUND OF THE INVENTION

1. Field of Invention

The present disclosure of invention relates to thin-film transistor (TFT) substrates of the type used in flat panel displays and to methods of fabricating the same, and more particularly, to a TFT array substrate whose array of transistors exhibit a high charge mobility and a high on/off current ratio and a method of fabricating the same.

2. Description of Related Technology

As liquid crystal displays (LCDs) become larger in size and higher in image resolution or other qualities, it becomes desirable to enhance electrical characteristics of thin-film transistors (TFTs) that are integrally formed in LCD panels, where the TFT's act as switches that couple image signals to pixel units containing the liquid crystals. In conventional TFTs, a hydrogenated form of amorphous silicon (a-Si:H) is used as a semiconductor film within which a channel portion of each TFT is formed.

The hydrogenated amorphous silicon, however, has a relatively low charge mobility and on/off current ratio as compared to field effect transistors (MOSFETs) whose channels are formed of monocrystalline silicon. In addition, since the hydrogenated amorphous silicon has an energy band gap of approximately 1.8 eV, it can convert light produced by an LCD backlighting unit into an undesirable leakage photocurrent that distorts the desired liquid crystal state for a given image. Also, an undesirable afterimage can be created due to an increase over time in the number of dangling bonds present in the a-Si:H TFT structure. Consequently, the already poor characteristics of the a-Si:H TFTs deteriorate over time as more dangling bonds are created.

SUMMARY

Aspects of the present disclosure include a method of fabricating a semiconductive oxide thin-film transistor (TFT) substrate including a semiconductive oxide TFT with superior characteristics.

Aspects of the present disclosure also provide a semiconductive oxide TFT substrate including a semiconductive oxide TFT with superior characteristics.

However, aspects of the present display are not restricted to the illustrative embodiments set forth herein.

According to an aspect of the present disclosure, there is provided a method of fabricating a semiconductive oxide TFT substrate and more particularly one having a column-IIIA-type oxide based thin film transistor (TFT). (Note that the specific semiconductive oxide TFT to be used is not germane to the present invention.) The method of substrate fabrication includes forming gate wiring on an insulation substrate; and forming a structure in which a semiconductive oxide film pattern and data wiring are stacked on the gate wiring, wherein the semiconductive oxide film pattern is divided into a first region and a second region, the first region is thinner than the second region, and the data wiring is formed on the second region.

According to another aspect of the present disclosure, there is provided a semiconductive oxide TFT substrate including gate wiring formed on an insulation substrate; a semiconductive oxide film pattern formed on the gate wiring and divided into a first region and a second region; and data wiring formed on the second region, wherein the first region is thinner than the second region.

BRIEF DESCRIPTION OF THE DRAWINGS

The above and other aspects and features of the present disclosure of invention will become more apparent by describing in detail exemplary embodiments thereof with reference to the attached drawings, in which.

DETAILED DESCRIPTION

Figure 1A:
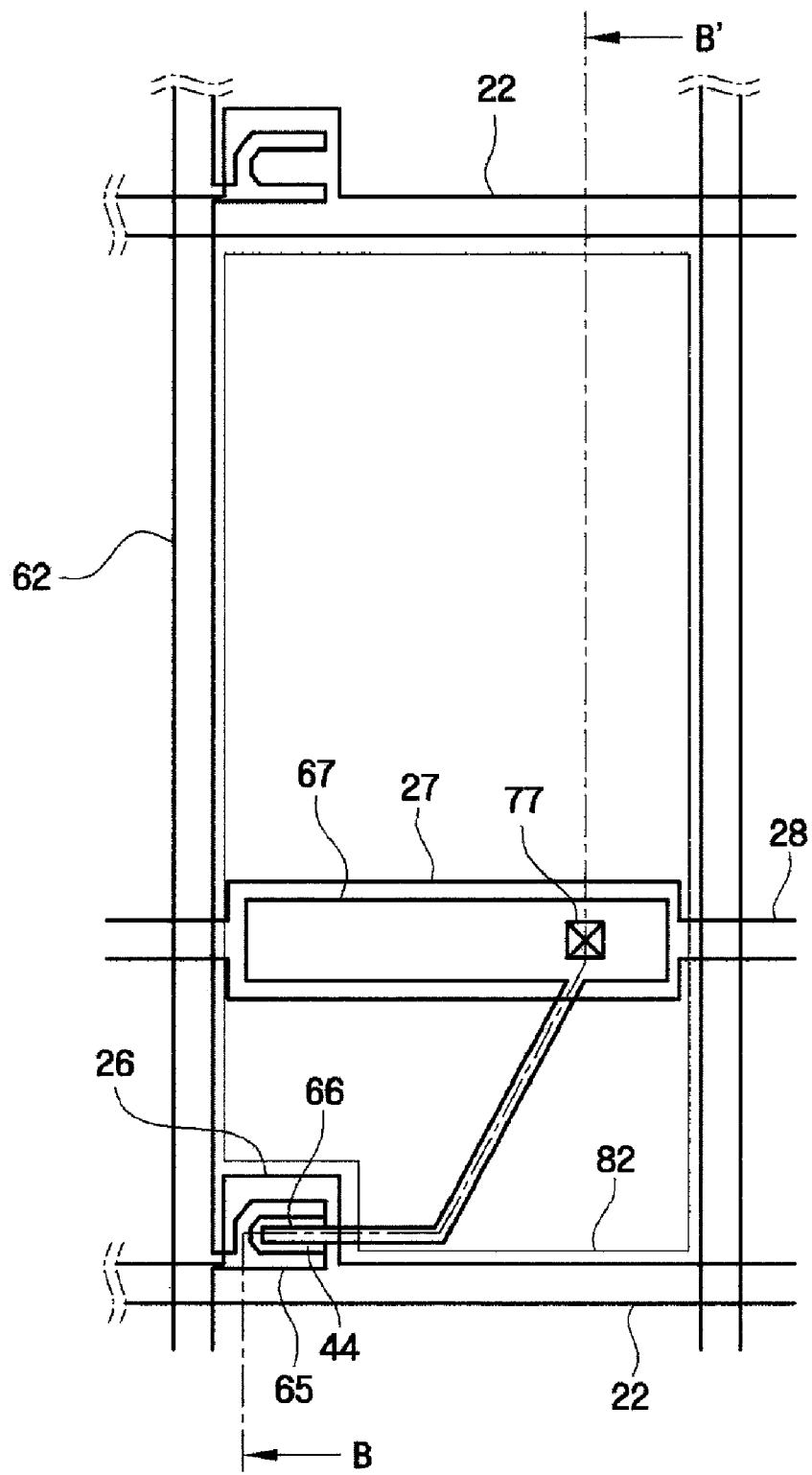
FIG. 1A is a layout diagram of a semiconductive oxide thin-film transistor (TFT) substrate according to an exemplary embodiment.

The here disclosed invention will now be described more fully with reference to the accompanying drawings, in which exemplary embodiments are shown. The disclosure of invention may, however, be conformed to in many different forms and should not be construed as being limited to the embodiments set forth herein. Where practical, like reference numerals in the drawings denote like elements, and thus repetition of their descriptions will be omitted.

It will be understood that, although the terms first, second, third, etc., may be used herein to describe various elements, components, regions, wirings, layers and/or sections, these elements, components, regions, wirings, layers and/or sections should not be limited by these terms. These terms are generally used to distinguish one element, component, region, wiring, layer or section from another element, component, region, wiring, layer or section. Thus, a first element, component, region, wiring, layer or section discussed below could be termed a second element, component, region, wiring, layer or section without departing from the teachings of the present disclosure.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure most closely pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments described herein with reference to cross-section illustrations are generally schematic illustrations of idealized embodiments and as such, variations from the shapes of the illustrations as a result, for example, of manufacturing techniques and/or tolerances, are to be expected. Thus, the illustrative embodiments should not be construed as limiting with respect to particular shapes of regions illustrated herein but are to include deviations in shapes that result, for example, from expediencies of mass production manufacturing. For example, an etched region illustrated as a rectangle well, typically, have rounded or curved features. Thus, the regions illustrated in the figures are schematic in nature and their shapes are not intended to illustrate the actual shape of a region of a device and are not intended to limit the scope of the disclosure.

Hereinafter, a column-IIIA-type oxide based thin-film transistor (TFT) substrate according to the present disclosure of invention will be described with reference to the attached drawings. Column IIIA refers to a column of the periodic table of elements that includes the elements gallium (Ga) and indium (In). The qualifier, "type" indicates that paired elements from surrounding columns of the periodic table may be compounded together to effectively define a IIIA entity such as by using zinc (Zn) from column IB paired with Tin (Sn) from column IVA in place of or in addition to a column IIIA element.

Figure 1B:
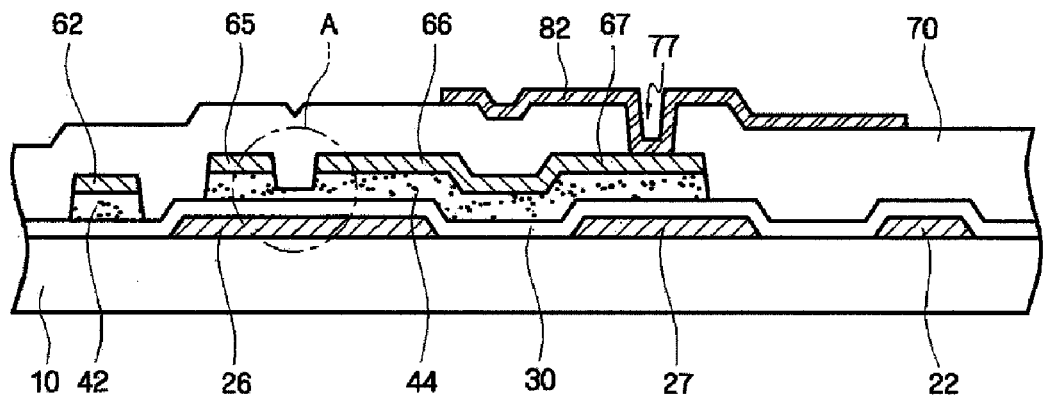
FIG. 1B is a cross-sectional view of the semiconductive oxide TFT substrate taken along a line B-B' of FIG. 1A.

First of all, the structure of a column-IIIA-type oxide based TFT substrate according to an exemplary embodiment will be described with reference to FIGS. 1A and 1B wherein layer 44 is composed of a column-IIIA-type semiconductive oxide. FIG. 1A is a layout diagram of a column-IIIA-type oxide based TFT substrate according to an exemplary embodiment. FIG. 1B is a cross-sectional view of the column-IIIA-type oxide based TFT substrate taken along a line B-B' of FIG. 1A.

Referring to FIGS. 1A and 1B, an electrically conductive gate line 22 extends horizontally on an electrically insulative but optically transparent substrate 10 (e.g., glass). In addition, an electrically conductive gate electrode 26, which is connected to the gate line 22 and has a protruding shape, is formed on the substrate 10. The gate line 22 and the gate electrode 26 are collectively referred to herein as gate wiring.

A storage electrode line 28 and a storage capacitor electrode 27 are also formed on the substrate 10. The storage electrode line 28 extends horizontally across a pixel region and substantially parallel to the gate line 22. The storage capacitor electrode 27 is connected to the storage electrode line 28 and has a relatively wide width for thereby defining a plate of a storage capacitor. The storage capacitor electrode 27 is spaced-apart from and faces in overlapping relation, a drain electrode extension portion 67 of a TFT drain electrode 66. The TFT drain electrode 66 connects via contact 77 to a pixel electrode 82, which will be described later. Accordingly the combination of the storage capacitor electrode 27 and the drain electrode extension portion 67 form a storage capacitor that improves the charge storage capability of the pixel unit beyond that of an liquid crystal charge storing capacitor formed by the pixel-electrode 82 and a spaced-apart counter-facing common electrode (not shown). The storage electrode 27 and the storage electrode line 28 are collectively referred to herein as storage wiring.

Each of the gate wiring and the storage wiring may be made of an appropriate electrically conductive material such as an aluminum (Al)-based metal, such as Al or an Al alloy, a silver (Ag)-based metal, such as Ag or an Ag alloy, a copper (Cu)-based metal such as Cu or a Cu alloy, a molybdenum (Mo)-based metal, such as Mo or a Mo alloy, chrome (Cr), titanium (Ti), or tantalum (Ta). However, the present disclosure is not limited thereto. The gate wiring and the storage wiring may be made of various other metals and/or alternative conductors.

A gate insulating film 30, which is made of a silicon nitride (SiNx such as $Si_3N_4$), is formed on the gate wiring and the storage wiring to thereby electrically separate them from a column-IIIA-type oxide based TFT (26/65-44-67) whose components shall now be detailed. Column-IIIA-type oxide based semiconductive patterns 42 and 44 are formed on the gate insulating film 30. The semiconductive patterns 42 and 44 are made of what are referred to herein as IIIA-type semiconductive oxides that contain oxygen (O) and at least one additional element selected from the group consisting of Zn (a column IB element), In (a column IIIA element), Ga (a column IIIA element) and Sn (a column IVA element). For example, the semiconductive oxide patterns 42 and 44 may be made of a compound of oxygen (an oxide) such as InZnO (a IIIA-IB oxide), InGaO (a IIIA-IIIA oxide), InSnO (a IIIA-IVA oxide), ZnSnO (a IB-IVA oxide), GaSnO (a IIIA-IVA oxide), GaZnO (a IIIA-IB oxide), or GaInZnO (a IIIA-IIIA-IB oxide). Charge carrier mobility may be provided by these materials and/or by addition of appropriate dopants. An electric field formed between a gate electrode and a source electrode of a to-be-described TFT can control the rate of flow of charge carriers through a channel region of the TFT. It is observed that the semiconductive oxide patterns 42 and 44 have far superior electrical characteristics than those of hydrogenated amorphous silicon (a-Si:H) and therefore form a superior TFT. More specifically, the effective charge mobility of the semiconductive oxide patterns 42 and 44 is about 2 to about 100 times greater than that of hydrogenated amorphous silicon. In addition, the on/off current ratio of TFTs made with the semiconductive oxide patterns 42 and 44 has a value of about $10^5$ to about $10^8$. Since the semiconductive oxide patterns 42 and 44 have a band gap of approximately 3.0 to 3.5 eV, they are resistant to absorbing visible light wavelengths from the LCD backlight and therefore no leakage photocurrent is generated in response to incident visible light. Hence, the formation of a momentary afterimage on a display panel using the semiconductive oxide TFT can be prevented, and there is no need to form a light-blocking film (black matrix) under the semiconductive oxide TFT as would be necessary in the case of a TFT based on an a-Si:H semiconductive film. Consequently, an aperture ratio (proportion of light passing area in a pixel area) of a liquid crystal display (LCD) can be increased. As already indicated, in order to enhance the characteristics of the semiconductive oxide patterns 42 and 44, an element, which belongs to group III, IV or V of a periodic table, or a transition element is included in the composition of to semiconductive oxide patterns 42 and 44. In the case of the column-IIIA-type oxide based TFT, the semiconductive oxide patterns 42 and 44 and data wiring may have different shapes to accommodate the specifications for the pixel unit that contains the TFT. However, in one embodiment, a 4-mask fabrication process is used and the semiconductive oxide patterns 42 and 44 are patterned to have shapes substantially identical to that of the corresponding data wirings, which will be described later, except that a thickness alteration is provided for a channel region of the column-IIIA-type oxide based TFT as shall be detailed below. Since the semiconductive oxide patterns 42 and 44 and the data wiring are patterned to have substantially identical shapes, one etching mask may be used to pattern both, as shall be described later in detail in relation to a method of fabricating the column-IIIA-type oxide based TFT substrate. In FIGS. 1A and 1B, the structure of the semiconductive oxide TFT substrate fabricated using the 4-mask process is illustrated. However, the core of the present disclosure is not limited to such a 4-mask process. That is, the present disclosure of invention also applies to mask processes other than the 4-mask process, such as those using a 5-mask process for example.

The data wiring is formed on the semiconductive oxide patterns 42 and 44 and the gate insulating film 30. The data wiring includes a data line 62, a source electrode 65, a drain electrode 66 and the drain electrode extension portion 67. The data line 62 extends vertically and crosses the gate line 22, thereby defining a pixel area bounded by the data line 62 and the gate line 22. The source electrode 65 branches off from the data line 62 and extends onto a source region portion of the semiconductive oxide pattern 44. The drain electrode 66 is separated from the source electrode 65 and formed on a drain region portion of the semiconductive oxide pattern 44 such that a channel region Aa (FIG. 2A) of the TFT is defined with respect to the gate electrode 26 of the semiconductive oxide TFT. The drain electrode extension portion 67 with a wide width extends from the drain electrode 66 and overlaps the storage electrode 27.

The data wiring may be made of a material that directly contacts the semiconductive oxide patterns 42 and 44 and thus forms a good ohmic contact with them. If the data wiring is made of a material having a work function smaller than that of a material of the semiconductive oxide patterns 42 and 44, the ohmic contact can be formed between the two materials. Therefore, if the work function of the material of the semiconductive oxide patterns 42 and 44 is approximately 5 eV or greater, e.g., approximately 5.1 to 5.3 eV, the data wiring may be made of a material having a work function of approximately 5.3 eV or less. If the difference between the work function of the data wiring and that of the semiconductive oxide patterns 42 and 44 is approximately 1.5 eV or less, reduced contact resistance characteristics can be obtained. Therefore, in order to form the ohmic contact with the semiconductive oxide patterns 42 and 44, the data wiring may be formed as a single layer or multiple layers made of Ni, Co, Ti, Ag, Cu, Mo, Al, Be, Nb, Au, Fe, Se or Ta as shown in Table 1 below. Alternatively, the data wiring may be made of an alloy of any one or more of the above metals and at least one element selected from the group consisting of Ti, Zr, W, Ta, Nb, Pt, Hf, O and N.

Table 1 below shows a work function of each metal that may be used for the data wiring.

TABLE 1

| | Metal | | | | | |
|---|---|---|---|---|---|---|
| | Ni | Co | Ti | Ag | Cu | Mo |
| Work Function (eV) | 5.01 | 5.0 | 4.7 | 4.73 | 4.7 | 4.5 |
| | Metal | | | | | |
| | Al | Be | Nb | Au | Fe | Se |
| Work Function (eV) | 4.08 | 5.0 | 4.3 | 5.1 | 4.5 | 5.11 |

If the semiconductive oxide patterns 42 and 44 directly contact a metal such as Al, Cu or Ag, the characteristics of the semiconductive oxide TFT, which uses the metal as the data wiring, and/or the ohmic contact characteristics of the semiconductive oxide patterns 42 and 44 with transparent indium tin oxide (ITO) or indium zinc oxide (IZO) used as the pixel electrode 82 may deteriorate due to reaction or diffusion between the semiconductive oxide patterns 42 and 44 and the directly contacting metal. Therefore, the data wiring may have to have a double-layered structure or a triple-layered structure where one or more interface materials are used that function as reaction and/or diffusion barriers.

If Al or an alloy of Al and any one of Nd, Sc, C, Ni, B, Zr, Lu, Cu and Ag is used for the data wiring, the data wiring may be formed as multiple layers including different types of layers formed on and/or under Al or the Al alloy. For example, the data wiring may be formed as a double layer, such as Mo(Mo alloy)/Al(Al alloy), Ti(Ti alloy)/Al(Al alloy), Ta(Ta alloy)/Al(Al alloy), Ni(Ni alloy)/Al(Al alloy) or Co(Co alloy)/Al(Al alloy), or a triple layer, such as Ti(Ti alloy)/Al (Al alloy)/Ti(Ti alloy), Ta(Ta alloy)/Al(Al alloy)/Ta(Ta alloy), Ti(Ti alloy)/Al(Al alloy)/TiN, Ta(Ta alloy)/Al(Al alloy)/TaN, Ni(Ni alloy)/Al(Al alloy)/Ni(Ni alloy), Co(Co alloy)/Al(Al alloy)/Co(Co alloy) or Mo(Mo alloy)/Al(Al alloy)/Mo(Mo alloy). In this case, the alloys may also contain Mo, W, Nb, Zr, V, O or N.

If Cu or a Cu alloy is used for the data wiring, there is no significant problem with the ohmic contact characteristics of the data wiring with the pixel electrode 82. Therefore, the data wiring may be formed as a double layer composed of a Cu or Cu-alloy layer and a Mo, Ti or Ta layer between the semiconductive oxide patterns 42 and 44. For example, the data wiring may be a double layer such as Mo(Mo alloy)/Cu, Ti(Ti alloy)/Cu, TiN(TiN alloy)/Cu, Ta(Ta alloy)/Cu, or TiOx/Cu.

The source electrode 65 at least partially overlaps the gate electrode 26, and the drain electrode 66 at least partially overlaps the gate electrode 26 to face the source electrode 65 with respect to the channel portion of the semiconductive oxide TFT.

As mentioned, in one embodiment, the drain electrode extension portion 67 overlaps the storage electrode 27, and thus the drain electrode extension portion 67 and the storage electrode 27 form a storage capacitor with the gate insulating film 30 and semiconductive oxide film 42 interposed therebetween. Alternatively, the storage capacitor may be formed using a different opposing electrode (not shown) and the storage electrode 27. The opposing electrode may be connected to the drain electrode 66 by the pixel electrode 82, formed in the same process as the drain electrode 66, and formed on the storage electrode 27. Also, the storage capacitor may be formed by overlapping the pixel electrode 82 and the storage electrode 27 with an appropriate dielectric interposed therebetween.

Except for the channel portion of the semiconductive oxide TFT, the shape of the semiconductive oxide patterns 42 and 44 is substantially identical to that of the data wiring. That is, in the channel portion of the semiconductive oxide TFT separates the source electrode 65 and the drain electrode 66 from each other, and otherwise the semiconductive oxide pattern 44 for the TFT continues without an interruption and thus forms the semiconductive portion of the TFT.

A passivation layer 70 is formed on the data wiring and on those parts of the semiconductive oxide pattern 44 exposed by openings in the data wiring. The passivation layer 70 may be an inorganic layer or an organic layer. In order to better protect the semiconductive oxide pattern 44 from external contaminants, the passivation layer 70 may have a double-layered structure including a lower inorganic layer and an upper organic layer.

A contact hole 77 exposing the drain electrode extension portion 67 is formed in the passivation layer 70.

The transparent pixel electrode 82 that covers the bulk of the pixel area is disposed on the passivation layer 70 after the latter layer is formed. The pixel electrode 82 is electrically connected to the drain electrode extension portion 67 by the contact hole 77. The pixel electrode 82 may be made of a transparent conductor, such as ITO or IZO, or in an alternate embodiment that does not require passage of light through the pixel area, of a reflective conductor such as Al.

Factors that affect the electrical characteristics of the semiconductive oxide TFT will now be described with reference to FIGS. 2A through 2C.

Figure 2A:
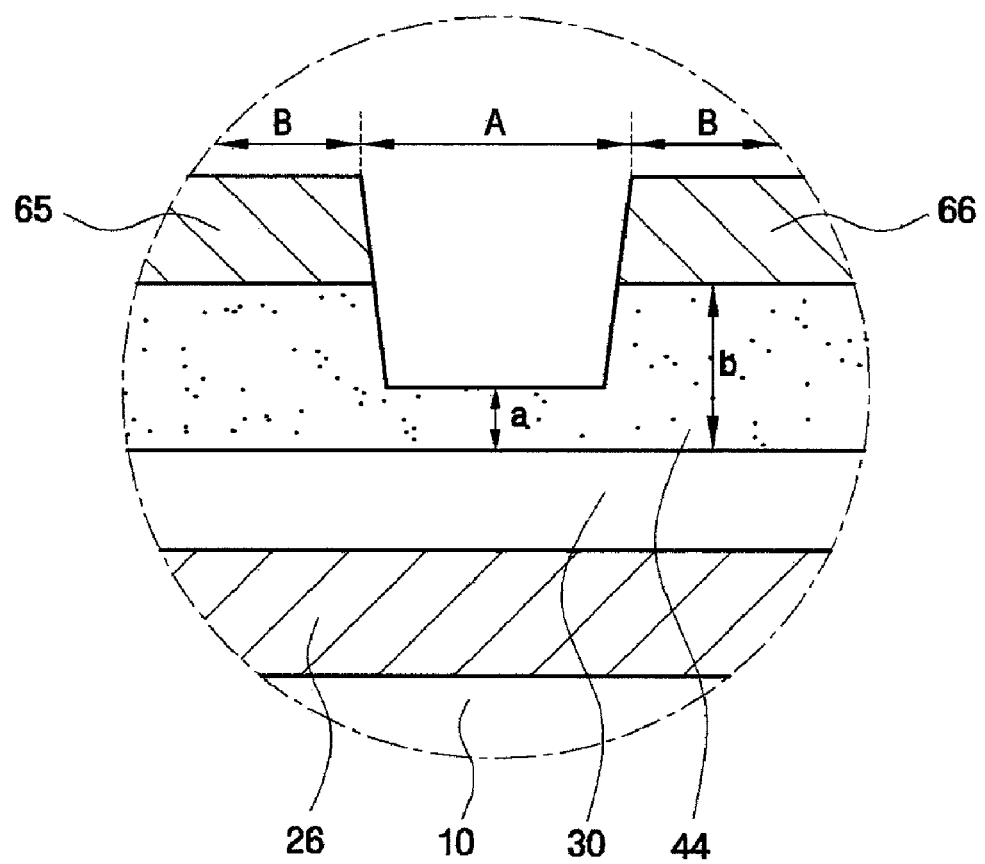
FIG. 2A is an enlarged view of a region A of the semiconductive oxide TFT substrate shown in FIG. 1B.

FIG. 2A is an enlarged view of a region A of the oxide TFT substrate shown in FIG. 1B. In FIG. 2A, a smallest thickness of a first region A is indicated by the lower case reference character 'a,' and a largest thickness of a second region B is indicated by the lower case reference character 'b'. In order for the semiconductive oxide TFT to work according to predetermined specifications, the widths of the first region A and of the second region B and the corresponding thicknesses, a, b, of the semiconductive oxide film 44 thereat should be controlled during mass production to have appropriate dimensions so that the gate-to-source voltage Vgs can exert appropriate control over drain-to-source current Ids.

Various compositions of semiconductive oxides may be formed by a variety of methods. However, for purpose of prototyping experimental results shown in the examples of FIGS. 2B and 2C, DC sputtering was used with a target having the following homogeneous composition: $Ga_2O_3$:$In_2O_3$:$ZnO$=1:1:1. In other words the ratios of the column-IIIA-type elements found in the target and intended to be produced in the prototype semiconductive oxide film composition was, Ga:In:Zn=2:2:1. Actual compositional results obtained by the prototype DC sputtering were measured by use of an ICP analysis technique (Ion Coupled Plasma). This method provided only the Ga/Zn and In/Zn ratios in the prototype sputter-produced semiconductive oxide films. The following ranges were identified quantitatively by the ICP analysis technique for the prototypes; Ga/Zn=1.9-2.5 and In/Zn=1.7-2.5. So this was in line with expectations due to the target composition. However, the actual compositional results obtained by the prototype DC sputtering method were also measured by use of XPS analysis (X-ray photoelectron spectroscopy). The XPS analysis did not produce results in line with expectations (Ga:In:Zn=2:2:1) but rather the following Ga/Zn and In/Zn ratios were identified quantitatively by XPS analysis; Ga/Zn=3.0-4.0; In/Zn=2.0-3.0. The reasons for the discrepancies are not fully understood at present.

Figure 2B:
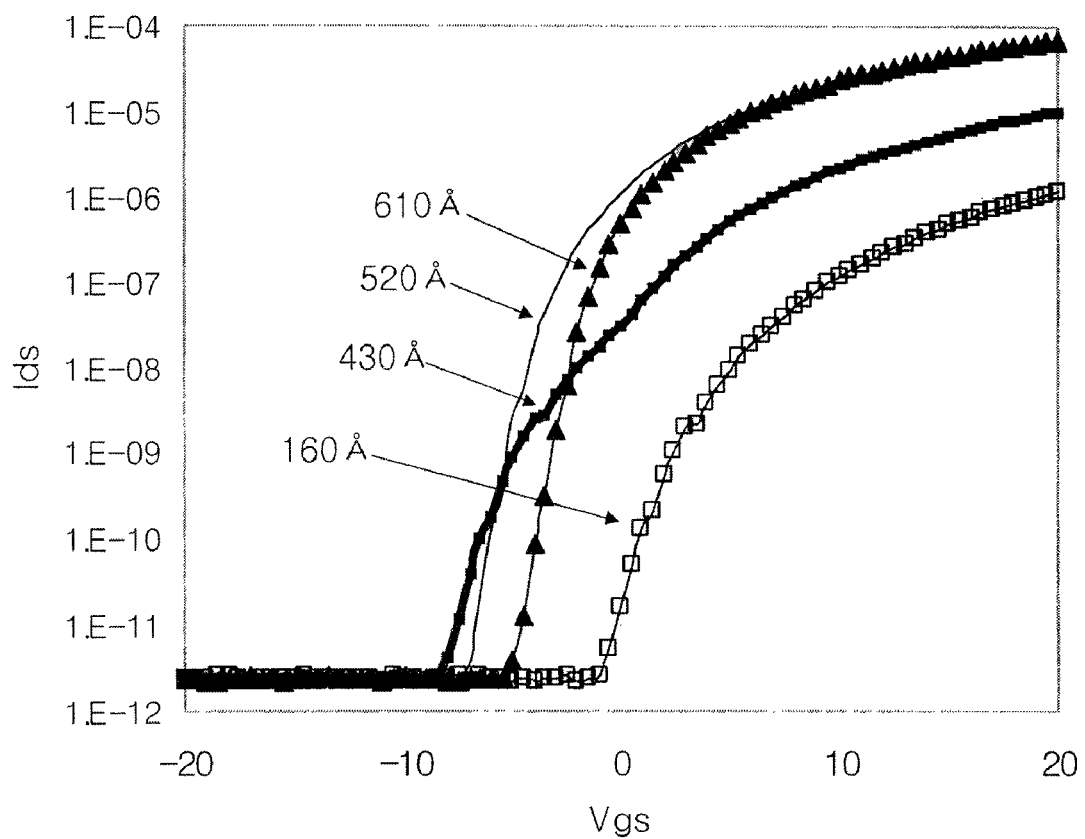
FIG. 2B is a graph showing the electrical characteristics of a column-IIIA-type oxide based TFT formed according to FIG. 1B.

FIG. 2B is a graph showing the electrical characteristics of a semiconductive oxide TFT manufactured with the aforementioned DC sputtering of a target having the homogeneous composition of $Ga_2O_3$:$In_2O_3$:$ZnO$=1:1:1 where the TFT was structured according to FIGS. 1A-1B under respective conditions wherein the smallest thickness 'a' of the first region A varies over the range 160 Å to 610 Å while the largest thickness b of the second region B is fixed at about 700 Å. Referring to FIG. 2B, it was discovered that if the thickness 'a' of the first region A, that is, the thickness of the transistor channel, is reduced to approximately 160 Å or less, leakage current (Ids) at a Vgs of about zero volts and below can be significantly reduced even while a turn on voltage of about 20V is applied to the gate of the TFT, and a corresponding data level of about 20V is applied to the source of the TFT and the drain is connected to a capacitor (to the pixel-electrode). As seen in FIG. 2B the drain-to-source current, Ids remains at substantially less than 1.E-06 Amperes at Vgs=0 for the cases of 'a' equals 160 Å (data points represented by open squares) and 'a' equals 430 Å (data points represented by darkened squares) while the drain-to-source current, Ids exceeds or comes significantly close to 1.E-06 Amperes (a microampere) at Vgs=0 for the cases of 'a' equals 520 Å (results represented by solid curve) and 'a' equals 610 Å (data points represented by darkened triangles). When Vgs crosses into the positive range between 0 volts and +20 volts, the results curve for 'a' equals 430 Å (data points represented by darkened squares) shows that this configuration can conduct an electrode charging current that is within about an order of magnitude of the turned-on currents conducted by the 'a' equals 610 Å and 'a' equals 520 Å examples. Thus, with appropriate choice of the thickness dimension 'a', the semiconductive oxide TFT cannot be used as a driving device for a display device where the choice of dimension 'a' depends on a trade-off to be made between low leakage current below Vgs=0 and adequate drive current above Vgs=0. As seen the case of 'a' equals 160 Å corresponds to a leakage current of about 1.E-11 and less for negative Vgs.

Figure 2C:
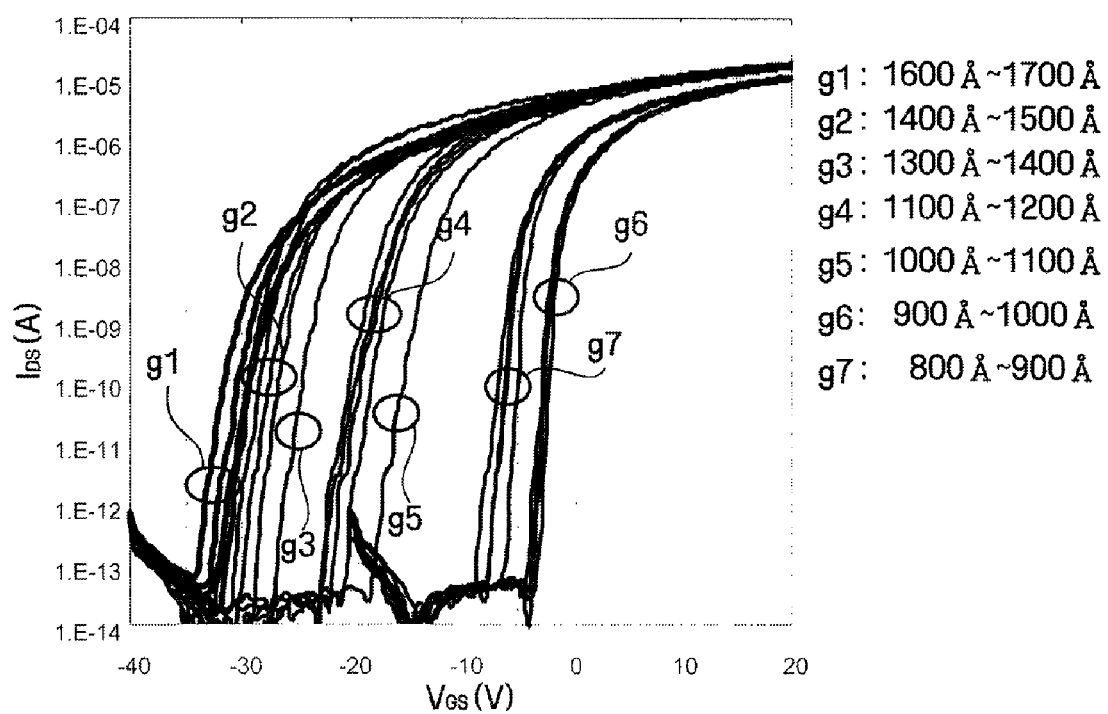
FIG. 2C is another graph showing the electrical characteristics of the semiconductive oxide TFT of FIG. 2B.

FIG. 2C is yet another graph showing the electrical characteristics of the semiconductive oxide TFT manufactured with the aforementioned DC sputtering of a target having the homogeneous composition of $Ga_2O_3$:$In_2O_3$:$ZnO$=1:1:1 where the TFT was structured according to FIGS. 1A-1B under respective conditions wherein the thickness 'b' of the second region B varies over the range 800 Å to 1700 Å while the thickness 'a' of the first region A is fixed at a value corresponding to one of those shown in FIG. 2B. In FIG. 2C, a first group g1 of results indicates the case where the thickness 'b' of the second region B is about 1600 to 1700 Å, a second group g2 indicates a case where the thickness 'b' of the second region B is about 1400 to 1500 Å, a third group g3 indicates a case where the thickness 'b' of the second region B is about 1300 to 1400 Å, a fourth group g4 indicates a case where the thickness 'b' of the second region B is about 1100 to 1200 Å, a fifth group g5 indicates a case where the thickness 'b' of the second region B is about 1000 to 1100 Å, a sixth group g6 indicates a case where the thickness 'b' of the second region B is about 900 to 1000 Å, and a seventh group g7 indicates a case where the thickness 'b' of the second region B is about 800 to 900 Å. As shown in FIG. 2C, as a value of the thickness b of the second region B is increased, a value of the threshold voltage (where Ids begins to exceed a predefined, turned-off value, e.g., 1.E-8 amps) of the semiconductive oxide TFT gradually becomes negative. In order for the semiconductive oxide TFT to have a threshold voltage of −20 or greater (for a corresponding Ids cross-over value of 1.E-8 amps), which is a voltage level required to digitally drive a display device with gate voltage that sweeps between +20V and −20V, the value of the thickness b of the second region B should be about 1300 Å or less (in other words, the low end of group g3 and better yet groups g4 through g7).

To summarize here the experimental results shown in FIGS. 2B and 2C, the largest thickness 'b' of the second region B is greater than the smallest thickness 'a' of the first region A, and a minimum value of the thickness 'a' of the first region is about 160 Å while a maximum value of the thickness 'b' of the second region B is about 1300 Å. Therefore, the thickness 'a' of the first region A may be approximately 160 Å to approximately 1300 Å. Accordingly, the thickness 'b' of the second region B may also be approximately 160 Å to approximately 1300 Å, with the constraint of 'a'<'b' being maintained. Without wishing to be bound to this theory, it is believed that these experimental results of the semiconductive oxide TFT are obtained due to physical characteristics of semiconductive oxide layer itself and in particular to the 'a' and 'b' dimensions used to define the channel and source/drain regions. Thus, in a semiconductive oxide TFT substrate according to the present disclosure, a b/a ratio may be provided, that is, a ratio of the thickness 'b' of the second region B to the thickness 'a' of the first region A, where b/a can range from at least 0.123 to less than 1. In this case, the leakage current of the semiconductive oxide TFT can be reduced in accordance with the illustrated experimental results of FIGS. 2B-2C. As noted, the 'a' and 'b' dimensions can be additionally varied so that a value of current when the semiconductive oxide TFT is deemed to be turned-on can be increased, and the semiconductive oxide TFT is deemed to have an appropriate threshold voltage for a given gate voltage swing.

Hereinafter, a method of fabricating a semiconductive oxide TFT having an appropriate b/a ratio according to various embodiments of the present disclosure will be described with reference to FIGS. 3 through 8. FIGS. 3 through 8 are cross-sectional views sequentially showing fabrication process steps included in a method of fabricating the semiconductive oxide TFT substrate of FIG. 1B according to an exemplary embodiment.

Figure 3:
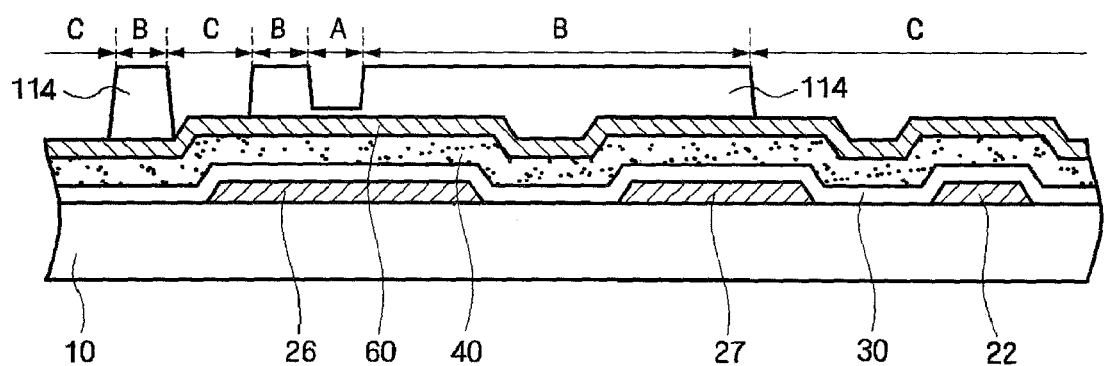
FIGS. 3 through 8 are cross-sectional views sequentially showing fabrication process steps included in a method of fabricating the semiconductive oxide TFT substrate of FIG. 1B.

Referring to FIG. 3, a multi-metals layer (not shown) for gate wiring is stacked on an insulation substrate 10 such as one made of glass. Then, the multi-metal layer is patterned to form the gate line 22, the gate electrode 26, and the storage electrode 27. Depending on the predetermined driving method used in the flat panel display, the storage electrode 27 may not be formed or formed differently. Each of the gate line 22, the gate electrode 26 and the storage electrode 27 may have a double-layered structure including a lower Al or Al alloy layer and an upper Mo or Mo alloy layer. Next, and still referring to FIG. 3, the gate insulating film 30 is deposited on the exposed parts of the insulation substrate 10, on the gate wiring and storage wiring by for example plasma enhanced chemical vapor deposition (PECVD) or reactive sputtering.

Then, a semiconductive oxide film 40 (e.g., a column-IIIA-type semiconductive oxide) and a conductive film 60 for data wiring are sequentially deposited one after the other on the gate insulating film 30 by way of, for example, radio frequency sputtering or direct current (DC) sputtering. In this case, if the semiconductive oxide TFT is being fabricated with a 4-mask process, the semiconductive oxide film 40 and the conductive film 60 can be successively deposited without patterning in between the deposition steps. Therefore, a continuous vacuum state can be maintained in the process chamber when the process of depositing the semiconductive oxide film 40 proceeds immediately to the process of depositing the conductive film 60. By depositing the semiconductive oxide film 40 and the conductive film 60 successively within a single vacuum chamber without breaking the vacuum therein, deterioration of characteristics of the semiconductive oxide film 40 due to oxygen in the air can be prevented. Consequently, the characteristics of the semiconductive oxide TFT can be enhanced.

Next, a photosensitive film (PR, not shown) is coated on the conductive film 60. After light is irradiated to the photosensitive film (the PR) using a predefined photomask, the photosensitive film is developed to form a hardened resist film pattern 114. The developed film pattern 114 includes an exposure region C exposing the conductive film 60 and first and second thickness regions A and B overlapping the conductive film 60. The first thickness region A is located over where the channel portion of the semiconductive oxide TFT will be formed, that is, between the source electrode 65 (see FIG. 1B) and the drain electrode 66 (see FIG. 1B). The second thickness region B is disposed on both sides of the first thickness region A. In one embodiment, the first thickness region A is vertically thinner than the second thickness region B so that partial etchback of the PR (114, FIG. 4) will produce a selectively exposed region over the to-be-formed channel area (A) in below described FIG. 5. A ratio of the vertical thickness of the first thickness region A to the vertical thickness of the second thickness region B may vary according to a processing condition in an etching process which will be described later.

There may be various methods used for varying the thickness of the developed photosensitive film 114 according to location (e.g., A versus B). For example, a mask having a slit or lattice pattern or a translucent film may be used to control light transmission into different parts of the PR (photoresist). Alternatively, the photosensitive film may be made of a material that can reflow to define areas of different thicknesses. Then, the photosensitive film may be exposed to light using a conventional photomask divided into a portion in which light can fully transmit and the other portion in which the light can fully be blocked. Next, the photosensitive film may be developed and reflowed to make a part of the photosensitive film run down from a film-remained region to a film-removed region. Consequently, the thin first thickness region A of the photosensitive film can be formed.

Figure 4:
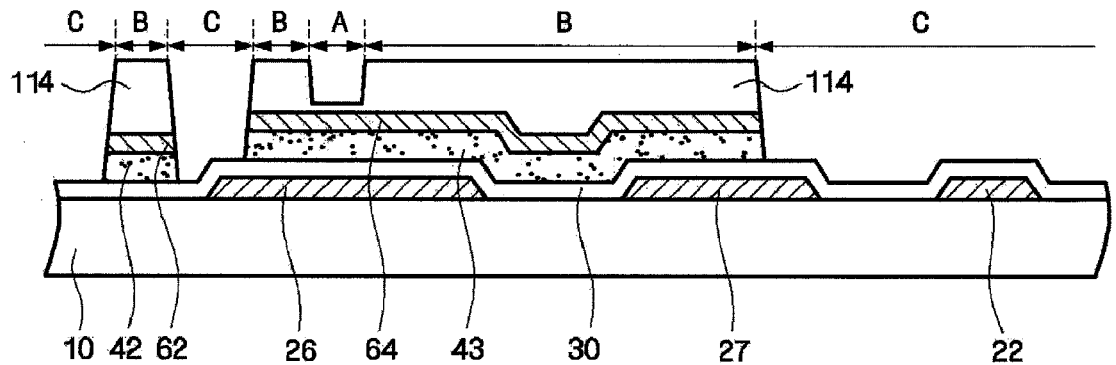

Referring to FIG. 4, the conductive film 60 and the semiconductive oxide film 40 are etched using the photosensitive film pattern 114 as an etching mask. As a result, conductive film patterns 62 and 64 under the first and second thickness regions A and B and semiconductive oxide film patterns 42 and 43 under the conductive film patterns 62 and 64 remain while the conductive film 60 and the semiconductive oxide film 40 in the exposure region C are selectively removed by successive metal and oxide etch processes, thereby exposing the gate insulating film 30 thereunder. The shape of the resultant restructure is identical to that of the data wiring (i.e., the data line 62, the source electrode 65, the drain electrode 66 and the drain electrode extension portion 67 in FIG. 1B) except that the source electrode 65 (see FIG. 1B) and the drain electrode 66 (see FIG. 1B) of the remaining conductive film patterns 62 and 64 are still connected to each other, not yet separated from each other.

The method of selectively etching the conductive film 60 and the semiconductive oxide film 40 using the same photosensitive film pattern 114 as an etching mask may vary according to types of materials that form the conductive film 60 and the semiconductive oxide film 40 and available limiting variables of the etching chamber and its etching processes.

If the conductive film 60 is a double or triple layer including a Mo or Mo alloy layer and an Al or Al alloy layer and the semiconductive oxide film 40 is a column-IIIA-type semiconductive oxide including O and at least one element selected from Ga, In and Zn, various etching methods may be used as follows.

According to an etching method, the conductive film 60 and the semiconductive oxide film 40 may be successively and collectively wet-etched using a mixed etchant under a first condition shown in Table 2 below. Through the successive and collective wet etching of the conductive film 60 and the semiconductive oxide film 40, the fabrication process of the semiconductive oxide TFT can be simplified.

According to another etching method, the conductive film 60 may be wet-etched, whereas the semiconductive oxide film 40 is dry-etched. In this case, the semiconductive oxide film 40 may be dry-etched using a fluorine (F)-based etching gas mixed with Ar or He. The fluorine-based etching gas may be $CHF_3$ or $CF_4$. In addition, the semiconductive oxide film 40 may be dry-etched using a reaction gas containing C, H and/or O.

According to another etching method, the conductive film 60 may be dry-etched using an F-based etching gas, a chlorine (Cl)-based etching gas or a mixture of the same, whereas the semiconductive oxide film 40 is wet-etched. If the conductive film 60 is dry-etched, more detailed patterning can be performed due to characteristics of anisotropic etching. The F-based etching gas may be $SF_6$, $CF_4$, $XeF_2$, $BrF_2$ or $ClF_2$, and the Cl-based etching gas may be $Cl_2$, $BCl_3$ or HCl. For example, the Mo layer may be dry-etched using a gas mixture of Cl2 and O2, and the Al layer may be dry-etched using a gas mixture of SF6 and Cl2. The semiconductive oxide film 40 may be wet-etched using an etchant, which contains de-ionized water mixed with hydrofluoric acid, sulfuric acid, hydrochloric acid or a combination of the same, or a mixed etchant under the first condition shown in Table 2 below.

According to another etching method, both of the conductive film 60 and the semiconductive oxide film 40 may be dry-etched.

Of the above etching methods, the method of successively etching the conductive film 60 and the semiconductive oxide film 40 under the same etching condition is most effective in terms of simplifying the fabrication process. In addition, the method of wet-etching the conductive film 60 in order to prevent the semiconductive oxide film 40 from being damaged by dry etching may be more effective.

TABLE 2

|  | Category | | |
| --- | --- | --- | --- |
|  | 1 | 3 | 2 |
| Etching method | Wet etching | Dry etching | Dry etching |
| Composition | Phosphoric acid (60~80 wt %) Nitric acid (3~15 wt %) Acetic acid (3~20 wt %) De-ionized water (0~10 wt %) Other additives | Ethylene glycol (0.1~30 wt %) HNO3 (0.1~20 wt %) H2SO4 (0.01~5 wt %) De-ionized water (remaining quantity) Other additives | O2, Cl2 (O2/Cl2 = 0.1~10 (sccm/sccm) |
| Etching speed of Conductive film for data wiring (Mo, Al, Cu, Ti, Ta) | 60~150 Å/sec | 0.5~2 Å/sec | 900~5400 Å/min |
| Etching speed of semiconductive oxide film (Ga, In, Zn, Sn, O) | 10~30 Å/sec | 10~30 Å/sec | 30~300 Å/sec |
| Etch selectivity of conductive film to semiconductive oxide film | 2:1~15:1 | 0.017:1~0.2:1 | 3:1~18:1 |

If the conductive film 60 includes a layer including a Mo, Ti or Ta layer or a Mo, Ti or Ta alloy layer and a Cu or Cu alloy layer and the semiconductive oxide film 40 is a semiconductive oxide film including O and at least one element selected from Ga, In and Zn, various etching methods may be used as follows.

According to an etching method, the conductive film 60 and the semiconductive oxide film 40 may be successively and collectively wet-etched using a mixed etchant including $H_2O_2$, HF(1~2%) and additives, a mixed etchant including phosphoric acid, nitric acid (1-5 wt %), acetic acid, sulfuric acid and additives, or a mixed etchant under the first condition shown in Table 2 above. Through the successive and collective wet etching of the conductive film 60 and the semiconductive oxide film 40, the fabrication process of the semiconductive oxide TFT can be simplified. This method may be more effective when the conductive film 60 is a double layer composed of Mo (Mo alloy)/Cu (Cu alloy).

According to another etching method, the conductive film 60 may be wet-etched, whereas the semiconductive oxide film 40 is dry-etched.

According to another etching method, if the conductive film 60 is a double layer composed of Ti (Ti alloy)/Cu (Cu alloy) or Ta (Ta alloy)/Cu (Cu alloy), the Cu (Cu alloy) layer may be wet-etched using an etchant without $H_2O_2$ while the Ti (Ti alloy) layer or the Ta (Ta alloy) layer under the Cu (Cu alloy) layer is dry-etched. This method may be more effective in terms of processing stability. When the Ti (Ti alloy) layer or the Ta (Ta alloy) layer under the Cu (Cu alloy) layer is dry-etched, $Cl_2$, $O_2$ or $SF_6$ may be used as a major etching gas. In this case, the underlying semiconductive oxide film 40 can be either dry-etched or wet-etched.

Figure 5:
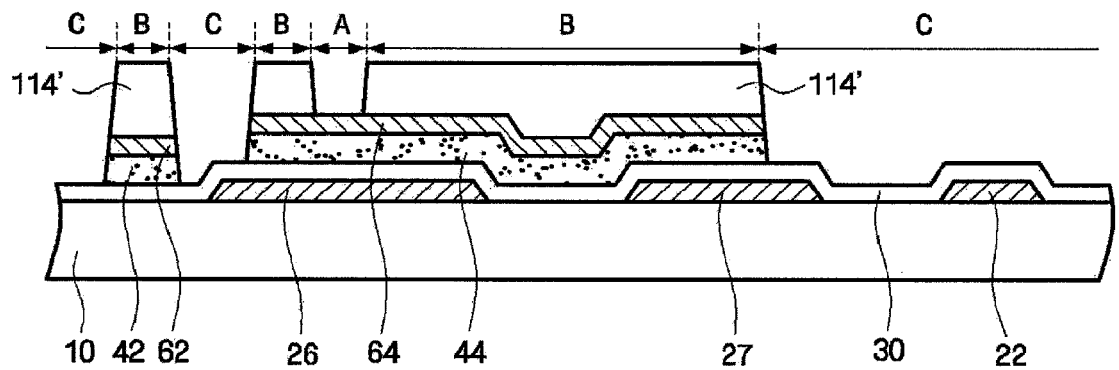

Referring to FIG. 5, the first thickness region A of the photosensitive film pattern 114 is etched-back and thus removed. As a result, a photosensitive film pattern 114' exposing the conductive film pattern 64 in the channel portion of the semiconductive oxide TFT is formed. The remaining portion of the photosensitive film on a surface of the exposed conductive film pattern 64 may be removed with an ashing process.

Figure 6:
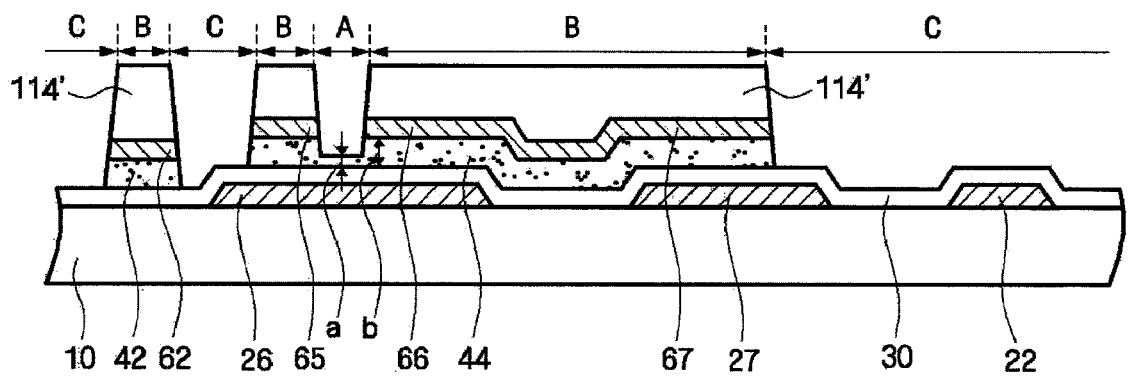

Referring to FIG. 6, the conductive film pattern 64 exposed as a result of the etch-back process is removed by wet etching, dry etching, or a combination of the same. Here, the wet-etch selectivity of the conductive film pattern 64 to the semiconductive oxide film 40 may be 2:1 to 15:1, and the dry-etch selectivity thereof may be at least 3:1 or higher.

Wet etching may be performed using a mixed etchant under the first condition shown in Table 2 above. Wet etching may also be performed using an etchant that contains de-ionized water mixed with hydrofluoric acid, sulfuric acid, hydrochloric acid or a combination of the same. Dry etching may be performed using a mixed etching gas under a second condition shown in Table 2 above or using various dry-etching methods described above. If the conductive film pattern 64 is a double layer composed of Ti (Ti alloy)/Cu (Cu alloy) or Ta (Ta alloy)/Cu (Cu alloy), it may be wet-etched and then dry-etched as described above.

When the conductive film pattern 64 is etched, part of the semiconductive oxide film pattern 44 in the channel portion of the semiconductive oxide TFT is etched according to etching selectivity. Accordingly, the b/a ratio has a value less than one. Then, the source electrode 65 and the drain electrode 66 are separated from each other, and the photosensitive film pattern 114' is removed as shown in FIG. 7, thereby completing the data wiring (i.e., the data line 62, the source electrode 65, the drain electrode 66 and the drain electrode extension portion 67).

Figure 7:
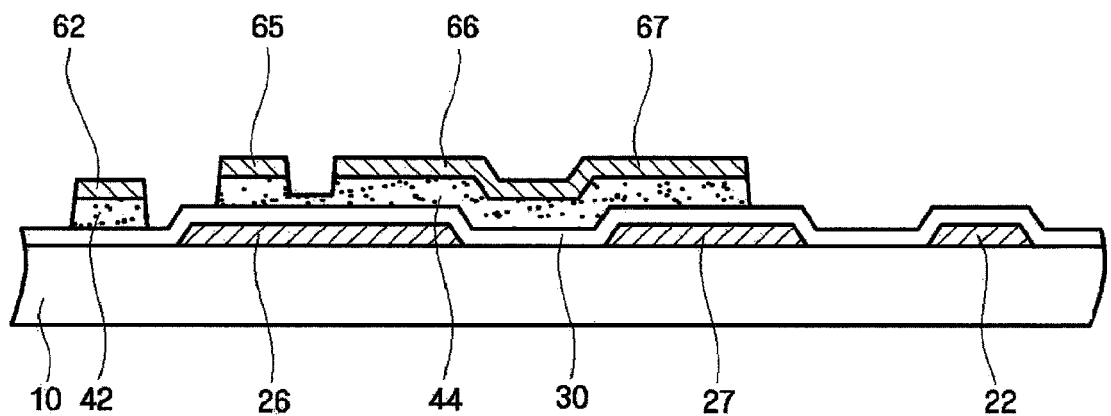
Figure 8:
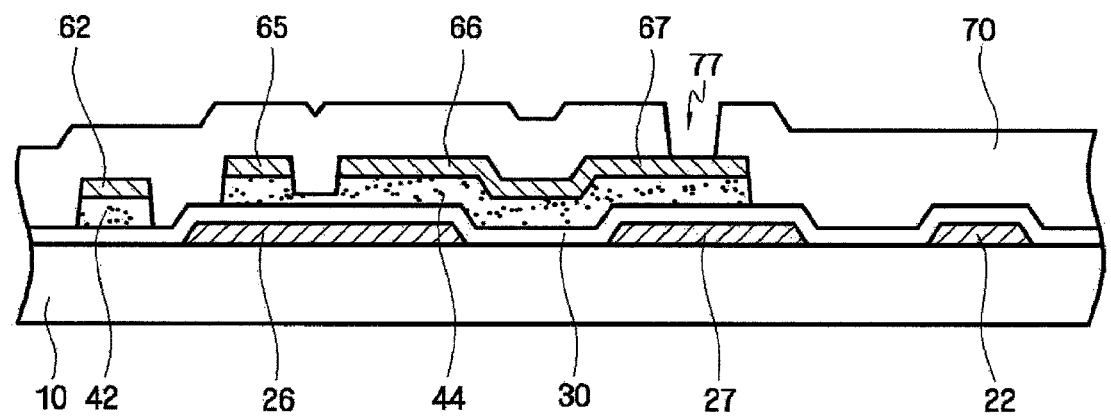

Referring to FIG. 8, the passivation layer 70 is formed on the resultant structure of FIG. 7. Then, the passivation layer 70 is selectively etched to form the contact hole 77 that exposes the drain electrode extension portion 67. If the passivation layer 70 is made of a photosensitive material, it is etched in a photolithography process to form the contact hole 77. If the passivation layer 70 is not made of a photosensitive material, the contact hole 77 is formed in an additional photosensitive mask process.

Finally, referring to FIG. 1B, a transparent conductor or a reflective conductor, such as ITO or IZO, is deposited and then etched in a photolithography process. Consequently, the pixel electrode 82 connected to the drain electrode extension portion 67 is formed.

The fabrication method of FIGS. 3 through 8 uses the 4-mask process. However, the present invention is not limited thereto. The semiconductive oxide TFT array substrate according to the present disclosure can also be fabricated using a 5-mask process.

When the 5-mask process is applied, the semiconductive oxide film 40 is deposited first. Then, the semiconductive oxide film 40 is etched to form the semiconductive oxide film pattern 43. This etching process may be performed using an etchant under the first or second condition shown in Table 2.

The conductive film 60 for data wiring is formed on a whole surface of the insulation substrate 10 on which the semiconductive oxide film pattern 43 is formed. Then, the conductive film 60 is etched to form the conductive film pattern 64 in the channel portion of the semiconductive oxide TFT. Next, the conductive film pattern 64 in the channel portion is removed by wet etching, dry etching or a combination of the same. Here, the wet-etch selectivity of the conductive film pattern 64 to the semiconductive oxide film pattern 43 may be 2:1 to 15:1, and the dry-etch selectivity thereof may be at least 3:1 or higher.

Since part of the semiconductive oxide film pattern 44 is etched according to etch selectivity, the b/a ratio has a value less than one. Then, the source electrode 65 and the drain electrode 66 are separated from each other, thereby completing the data wiring.

The subsequent process is substantially identical to the 4-mask process, and thus a detailed description thereof will be omitted.

The method of fabricating a semiconductive oxide TFT substrate according to the present disclosure is not limited to the above embodiments. That is, the fabrication method can also be easily applied to a color filter-on-array (COA) structure in which a color filter is formed on a semiconductive oxide TFT array or an array-on-color filter (AOC) structure in which a color filter is formed before a semiconductive oxide TFT array is formed.

While the present disclosure of invention makes reference to exemplary embodiments, it is to be understood by those of ordinary skill in the art that various changes in form and detail may be made without departing from the spirit and scope of the present disclosure. The exemplary embodiments should be considered in a descriptive sense only and not for purposes of limitation.

What is claimed is:

1. A method of fabricating a display substrate having an array of semiconductive oxide thin-film transistors (TFTs), the method comprising:
   forming gate wiring on an insulation substrate; and
   stacking a combination of a semiconductive oxide film pattern and data wiring on the gate wiring, wherein said stacking comprises selectively thinning the semiconductive oxide film pattern at channel portions thereof so that the semiconductive oxide film pattern is divided into first regions and correspondingly adjacent second regions, the first regions being substantially thinner than the second regions, and where the data wiring is operatively coupled to the thicker second regions, wherein a ratio of a thickness of a given first region to a thickness of its correspondingly adjacent second region is 0.123 or higher, but less than 1.

2. The method of claim 1, wherein a work function of the data wiring is approximately 5.3 eV or less.

3. The method of claim 1, wherein the data wiring is a double layer comprised of any one of Mo(Mo alloy)/Al(Al alloy), Ti(Ti alloy)/Al(Al alloy), Ta(Ta alloy)/Al(Al alloy), Ni(Ni alloy)/Al(Al alloy) and Co(Co alloy)/Al(Al alloy) or a triple layer comprised of any one of Ti(Ti alloy)/Al(Al alloy)/Ti(Ti alloy), Ta(Ta alloy)/Al(Al alloy)/Ta(Ta alloy), Ti(Ti alloy)/Al(Al alloy)/TiN, Ta(Ta alloy)/Al(Al alloy)/TaN, Ni(Ni alloy)/Al(Al alloy)/Ni(Ni alloy), Co(Co alloy)/Al(Al alloy)/Co(Co alloy) and Mo(Mo alloy)/Al(Al alloy)/Mo(Mo alloy).

4. The method of claim 1, wherein a band gap of the semiconductive oxide film pattern is 3.2 to 3.4 eV.

5. The method of claim 4, wherein a difference between the work functions of the data wiring and the semiconductive oxide film pattern is approximately 1.5 eV or less.

6. The method of claim 1, wherein the thickness of the first region is 160 Å or greater but less than about 1300 Å.

7. The method of claim 6, wherein:
   said stacking further comprises:
   forming the semiconductive oxide film pattern on the gate wiring;
   forming the conductive film on the semiconductive oxide film pattern;
   etching the conductive film to form a conductive film pattern; and selectively removing the conductive film pattern in regions thereof over the first regions of the semiconductive oxide film pattern.

8. The method of claim 6, wherein:
said stacking further comprises:
  depositing a semiconductive oxide film on the gate wiring;
depositing a conductive film on the deposited semiconductive oxide film;
  forming a patterned etch mask on the stacked films where the etch mask has a first thickness region which corresponds to a to-be-formed first region of the thinned semiconductive oxide film pattern, where the etch mask has a second thickness region which corresponds to a to-be-formed second region of the thinned semiconductive oxide film pattern, and where the second thickness region of the etch mask is thicker than the first thickness region, where the etch mask has an exposure region which exposes the underlying conductive film;
  etching the conductive film and the oxide semiconductor film exposed by the exposure region of the patterned etch mask;
  removing the first thickness region of the etch mask pattern; and
  etching the conductive film exposed after the first thickness region is removed.

9. The method of claim 8, wherein, in the stacking of the semiconductive oxide film and the conductive film, the semiconductive oxide film and the conductive film are successively deposited within a single vacuum chamber.

10. The method of claim 9, wherein the conductive film comprises at least one of Al, Cu, Ti, Ta and Mo, and the semiconductive oxide film comprises O and at least one element selected from the group consisting of Ga, In, Zn and Sn.

11. The method of claim 10, wherein the conductive film is comprised of a lower Ti or Ta layer and an upper Cu layer, and the upper layer of the conductive film is wet-etched while the lower layer of the conductive film is dry-etched.

12. The method of claim 10, wherein, in the etching of the conductive film and the semiconductive oxide film exposed by the exposure region of the etch mask, the conductive film and the semiconductive oxide film are successively etched under same etching conditions.

13. The method of claim 12, wherein in the etching of the conductive film and the semiconductive oxide film exposed by the exposure region of the etch mask, the conductive film is wet-etched.

14. The method of claim 12, wherein the conductive film is a multi-layer film comprised of a Mo layer and an Al layer or a Mo layer and a Cu layer.

* * * * *